United States Patent [19]
Glavitsch et al.

[11] 4,302,716
[45] Nov. 24, 1981

[54] CONTROLLABLE PHASE SHIFTER
[75] Inventors: Hans Glavitsch, Nussbaumen; Gerhard Güth, Baden, both of Switzerland
[73] Assignee: BBC Brown, Boveri & Company Limited, Baden, Switzerland
[21] Appl. No.: 92,348
[22] Filed: Nov. 8, 1979
[30] Foreign Application Priority Data
Nov. 26, 1978 [CH] Switzerland ............... 12049/78
[51] Int. Cl.³ .................................. H03K 3/352
[52] U.S. Cl. ..................................... 323/217
[58] Field of Search .......... 307/262; 323/8, 36, 323/101, 108, 119, 121, 124, 127, 128, 217

[56] References Cited
U.S. PATENT DOCUMENTS
2,524,760 10/1950 Brown ..................... 323/119 X
2,524,762 10/1950 Brown ..................... 323/119 X
3,849,677 11/1974 Stacey et al. ............. 323/124 X Primary Examiner—A. D. Pellinen
Attorney, Agent, or Firm—Werner W. Kleeman

[57] ABSTRACT
Controllable phase shifters containing reactances and valve switching devices are used for compensation and stabilizing purposes in alternating current-energy transmission systems. There is desired a phase shift which can be continuously controlled within variable limits and with comparatively low expenditure in circuit components. There is provided at least one shunt circuit branch between primary terminals having mutual phase shifted voltages, and a tap provided as a secondary terminal supplies a secondary voltage or potential having a phase between that of the primary terminals. At both sides of the secondary terminal there are arranged in the shunt circuit branch preferably complementary reactive impedances. At least one valve switching device, controllable with respect to its gating behavior, is arranged in series or parallel to one such impedance and renders possible changing the magnitude of the impedance which is effective for the fundamental oscillation, and thus, a change of the control phase angle. Preferably valve switching devices are provided at both sides, and, if desired, in combination parallel and in series with the impedances to both sides of the secondary terminal, thereby realizing the advantage of a phase angle control in both directions and over wide ranges of the primary phase angle.

10 Claims, 9 Drawing Figures

CONTROLLABLE PHASE SHIFTER

BACKGROUND OF THE INVENTION

The present invention relates to a new and improved construction of controllable phase shifter. More specifically, the controllable phase shifter of the present development is used for an alternating current-transmission system, especially for a line or power network, wherein there is provided a number of reactive impedances connected with the lines of the transmission system and a valve switching device which can be controlled with respect to the phase shift angle which is to be set.

The hereinafter premised features will be found, for instance, in the generally known chokes which can be switched between taps or can be periodically turned-on for controllable intervals by means of semiconductor-switching valves, especially thyristor or triac switching valves, in order to thereby control the effective inductance of such chokes. Such type reactance elements are employed, for instance, in energy transmission lines in order to improve the transmission characteristics. Further, appropriately constructed reactance transformers are used, for instance, for the transient increase of the torque at synchronous generators and for the purpose of improving the stability of compound operation.

The mentioned equipment is associated with the drawback that there is required a comparatively high expenditure in equipment components, especially when using chokes or transformers with taps. This is directly opposed to the desired wide field of application for power line networks and for other fields of use.

SUMMARY OF THE INVENTION

Therefore, with the foregoing in mind it is a primary object of the present invention to provide a new and improved construction of a controllable phase shifter which possesses a comparatively simple construction with continuous controllability of the phase shift angle and can be freely controlled with respect to the direction of the phase shift.

Now in order to implement this object and others which will become more readily apparent as the description proceeds, the controllable phase shifter of the present development is manifested by the features that between at least two primary side terminals of the transmission system, carrying mutual phase shifted potentials, there is arranged a shunt circuit branch. This shunt circuit branch contains at least two series connected, reactive impedances and a tap serving as a secondary side terminal arranged between such impedances and at least one valve switching device. A control device is provided for the valve switching device in order to adjust different cut-on and/or cut-off intervals.

A controllable phase shifter of such construction basically can be designed, without the need for special transformers, with fixed chokes and/or capacitors. Moreover, the variable control of the cut-on and cut-off intervals of the valve switching device renders possible a variable phase shift in both directions. As the valve switching device there can be simply employed an alternating current-semiconductor valve, such as a triac or thyristors in inverse-parallel or antiparallel connection and, if desired, also switching transistors, with variable firing angle control for purpose of phase angle control or with pulse width modulation according to variable gating conditions. In particular, the last-mentioned embodiment renders possible, in a simple manner, suppressing disturbing upper harmonics owing to the switching operation.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
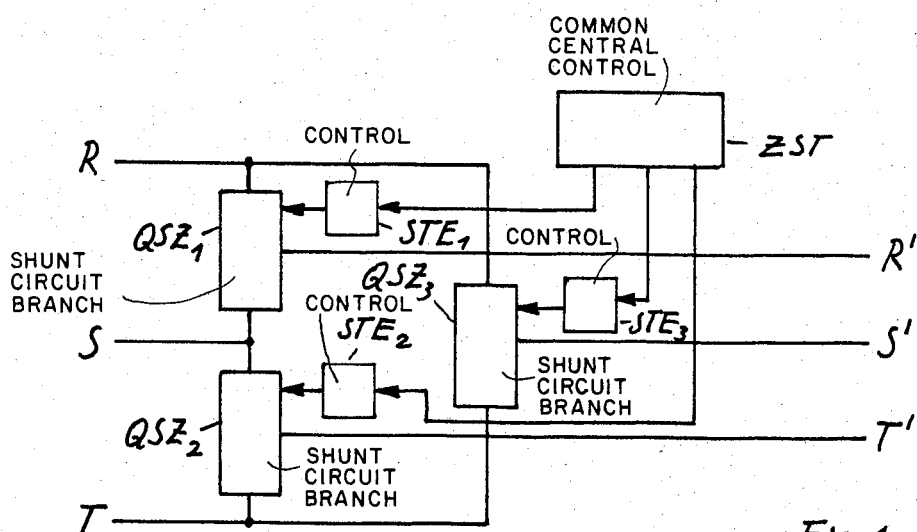
FIG. 1 is a principal circuit diagram of a first exemplary embodiment of controllable phase shifter for a three phase-alternating current system.

Describing now the drawings, the exemplary embodiment of phase shifter shown in FIG. 1 will be seen to comprise three shunt switching or switching branches $QSZ_1$, $QSZ_2$ and $QSZ_3$ connected in delta configuration between the primary side-phase terminals or connections R, S, T of the three phase system and each having a tap as the secondary side terminal or connection R', S', T'. Constituting part of each shunt switching branch is a control device $STE_1$, $STE_2$ and $STE_3$, respectively. These control devices $STE_1$, $STE_2$, $STE_3$, by means of related valve switching devices, by periodically switching-in and switching-out reactive impedances, connect the secondary side terminal of the related shunt circuit branch at the center throughout the switching periods as a function of the switching-on and switching-off ratio (gating ratio), more intensely with the one or other of the two primary side terminals of the related shunt circuit branch. The control devices $STE_1$, $STE_2$ and $STE_3$ are connected with a common central control device ZST insuring for a coordinated control operation according to the requirements of the multi-phase system.

Figure 2:
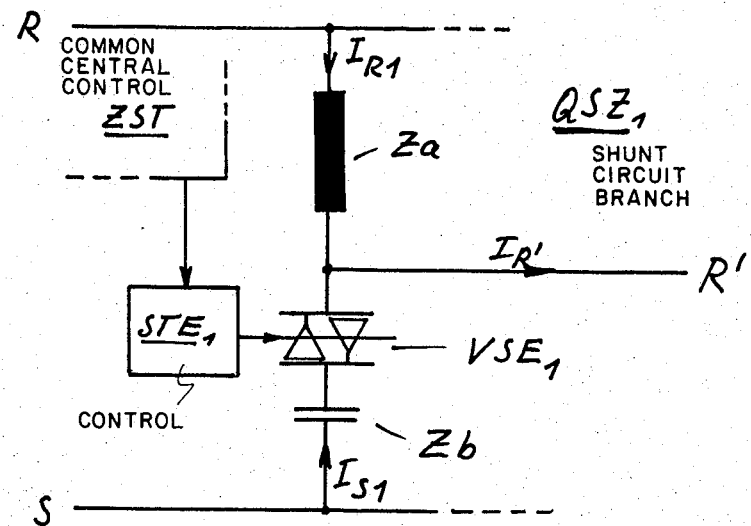
FIG. 2 is a detail circuit diagram of the shunt circuit branch of a phase shifter of the type shown in FIG. 1 containing reactive impedances, valve switching device and control device for the valve switching device.

FIG. 2 shows the contruction in detail of, for instance, a shunt circuit branch $QSZ_1$. There will be seen that at both sides of the secondary side terminal $R_1$ there is arranged a respective reactive impedance Za and Zb, and specifically, in series between the primary side terminals R and S. In the embodiment under discussion, constituting a design having the advantage of particular simplicity, there is only provided at one side of the secondary side terminal a series connected valve switching device VSE$_1$ controlled by the related control device STE$_1$ in terms of performing a periodic switching-on and switching-off operation with predetermined gating ratio. In the simplest case there can be used for this purpose a firing angle control for phase angle control, which when employing standard thyristors or triac valves only requires a firing control at predetermined phase angles of the network voltage. The amplitude of the first harmonic or fundamental oscillation of the alternating current which flows through the related impedance, here the impedance Zb, and thus, the effective magnitude of such impedance, therefore can be continuously controlled in accordance with the half oscillation-gating ratio, i.e., the effective divider ratio of the voltage divider formed by the shunt circuit branch.

Starting from the divider ratio, governed directly by the impedances Za and Zb, during full control of the value switching device, with the embodiment under discussion this divider ratio of course only can be changed in one direction with one valve switching device, and specifically, until there is an exclusive coupling of the phase line R' with the phase line R by means of the impedance Za with continously blocking valve switching device VSE$_1$, i.e. with an infinite value of the impedance at the side of the primary side terminal S.

If the upper harmonic content of the shunt current disturbs, and which can be changed with the gating ratio, and thus there is a disturbance by the secondary voltage or potential, then advantageously there can be employed a pulse width modulation of greater frequency than the network frequency, such pulse width modulation being carried out in conventional fashion with variable gating ratio. The expenditure of filters which may be required for suppressing the upper harmonics is then comparatively low.

Figure 3:
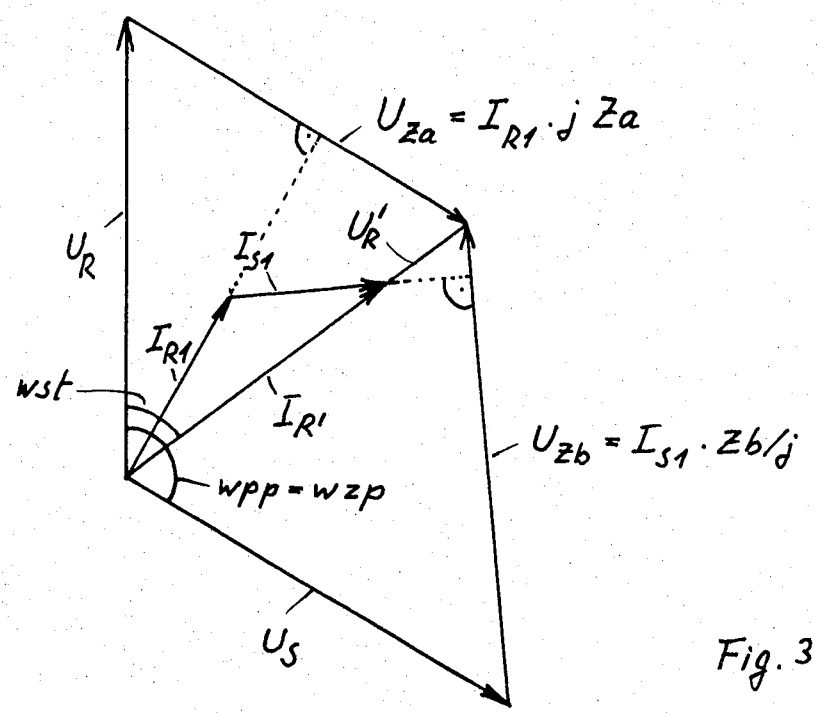
FIG. 3 is a vector diagram for explaining the mode of operation of the circuit components of FIG. 2.

FIG. 3 illustrates the phase shift of the secondary voltage U'$_R$ in relation to the primary voltages U$_R$, U$_S$. The reference arrows which have been incorporated into the illustration of FIG. 2 are valid for the currents I$_{R1}$, I$_{S1}$, I$_R$, flowing in both sections of the shunt circuit branch and in the secondary terminal. Of course, the illustration only relates to the network frequency-fundamental oscillations of the currents and voltages and to the impedances which are effective for such fundamental oscillations.

Because of the complementary, i.e. inductive and capacitive, reactive impedances Za and Zb, in the embodiment of FIG. 2, there are realized for the assumed phase equality of the voltage U$_R$ and the current I$_R$, (purely secondary side effective load) the shunt voltages U$_{Za}$ and U$_{Zb}$, which govern the magnitude and phase of the secondary voltage U'$_R$. By changing the effective magnitude of, for instance, the impedance Zb by means of the valve switching device VSE$_1$ it is possible to noticably alter the control phase angle $\overline{wst}$. The possible range of change of the control phase angle $\overline{wst}$ is, among other things, also dependent upon the primary phase angle $\overline{wpp}$ between the primary voltages U$_R$ and U$_S$ belonging to the related shunt circuit branch. With the present simple embodiment having primary terminals directly situated at the shunt circuit branch, the primary phase angle $\overline{wpp}$ is equal to the intermediate phase angle $\overline{wzp}$ of the multi-phase system.

Figure 4:
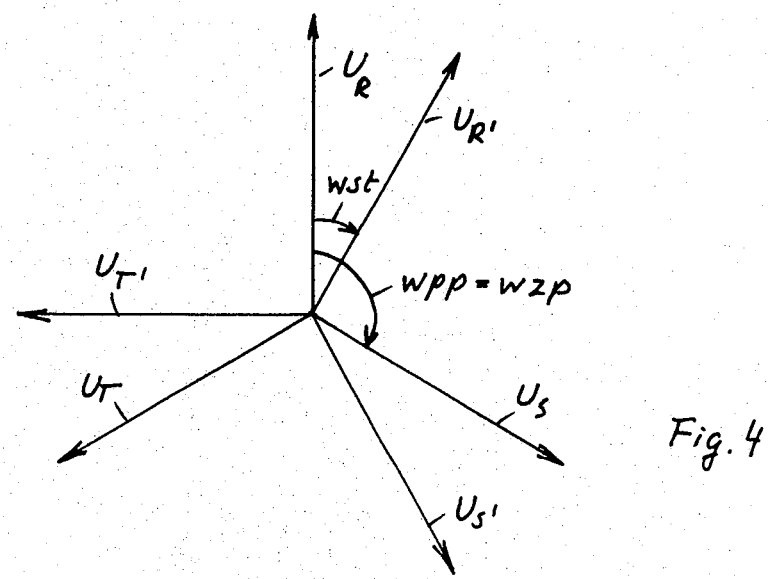
FIG. 4 is a vector diagram for explaining the thus obtainable, variable phase shift in multi-phase systems.

For the three phase system of FIG. 1 there are thus realized in totality the relationships indicated in FIG. 4 for the phase shift of the secondary voltages U$_{R'}$, U$_{S'}$, U$_{T'}$ in relation to the primary voltages U$_R$, U$_S$, U$_T$.

Basically, there can be provided within a shunt circuit branch, to both sides of the tap or secondary terminal, similar type reactive impedances. The use of complementary reactive impedances however affords the advantage that the reactive load of the system can be maintained comparatively small within an intermediate region of the voltage divider ratio, i.e. with comparatively little differing values of the effective reactances to both sides of the tap.

The use of an intermediate phase angle as the primary phase angle, i.e., the connection of the shunt circuit branch directly at the primary phases of the system, results in comparatively pronounced changes of the secondary voltage with the phase shift, something generally undesired. Additionally, there seldom can be considered an extensive utilization of the control range for the control phase angle which is governed by the large primary phase angle corresponding to the intermediate phase angle. Hence, there is possible as a particular advantage an embodiment wherein at least one pair of primary terminals, each correlated to a secondary terminal, carry potentials which are shifted in relation to one another by a primary phase angle differing from the intermediate phase angle of the multi-phase system, the primary phase angle preferably being smaller in relation to such intermediate phase angle.

Figure 5:
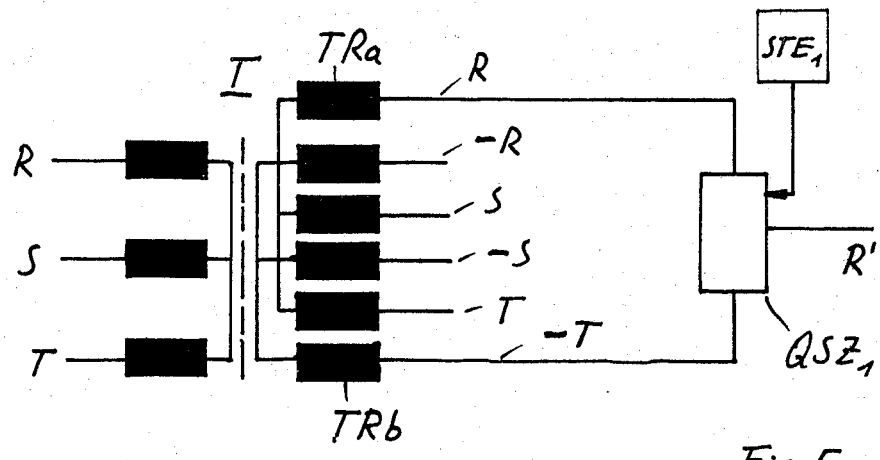
FIG. 5 is a principle circuit diagram of a different embodiment of controllable phase shifter for a three phase system.

FIG. 5 illustrates such embodiment wherein a primary phase angle of 60° is realized with the aid of a primary side-network transformer T having two secondary winding systems which are connected in wye and are oppositely poled or wound. Hence, there are available in pairs oppositely poled primary terminals R and —R, S and —S, T and —T which are phase shifted by 180° relative to one another. To preserve clarity in illustration FIG. 5 only shows a shunt circuit branch QSZ$_1$ with secondary R' between the primary terminals R and —T corresponding to the secondary windings TRa and TRb of the network transformer. The other phases of the system are correspondingly connected.

Figure 6:
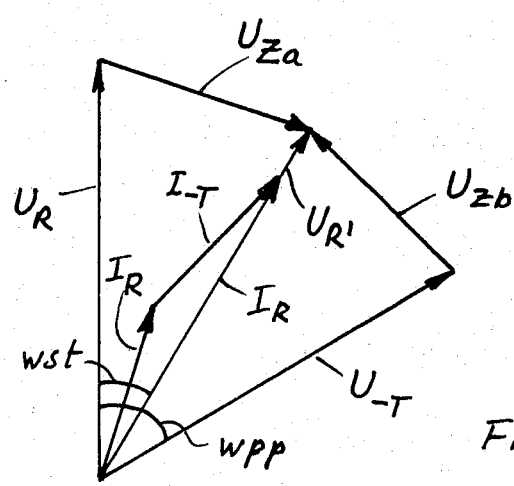
FIG. 6 is a vector diagram for explaining the mode of operation of the phase shifter of FIG. 5.

In the vector diagram of FIG. 6 the primary phase angle $\overline{wpp}$ of 60° has been indicated with an intermediately situated control phase angle $\overline{wst}$. The construction of the vector diagram corresponds to FIG. 3, and instead of the primary voltage U$_S$ there now appears the voltage U$_{-T}$ and instead of the current I$_{S1}$ the current I$_{-T}$. Moreover there are valid the following relationships for the shunt voltages:

$$U_{Za} = I_R \cdot j \, Za$$

$$U_{Zb} = I_{-T} \, Zb/j$$

As is apparent the amplitude of the secondary voltage U$_{R'}$ only deviates slightly, in the control range, from the amplitudes of the primary voltages.

Figure 7:
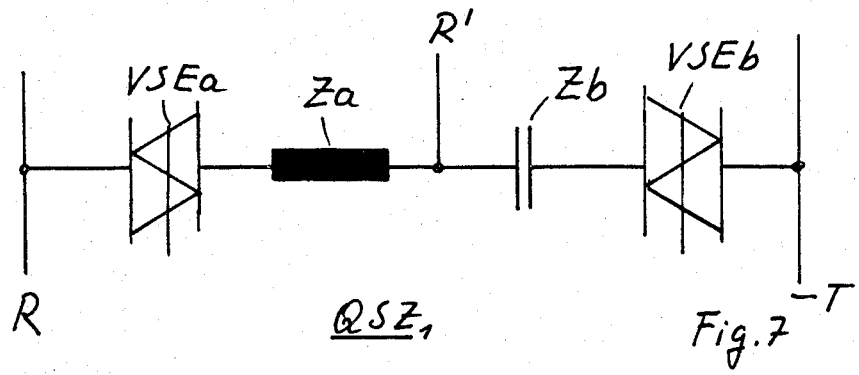
FIG. 7 illustrates a further exemplary embodiment of shunt circuit branch containing complementary reactive impedances and series connected-valve switching device.

FIG. 7 shows the principle construction of a shunt circuit branch with complementary reactive impedances Za and Zb and in contrast to the embodiment of FIG. 2 also, to both sides of the secondary terminal or connection R', a respective valve switching device VSEa and VSEb. These valve switching devices are arranged in series in the shunt circuit branch and enable, in the presence of an opposite or complementary control with respect to the gating ratio, a phase shift in both directions, starting from the output phase of the secondary voltage with respect to the primary voltage, this output phase being directly governed by the impedances Za and Zb.

An arrangement of the valve switching device in parallel to the related impedances in the shunt circuit branch affords special advantages for a number of fields of application.

Figure 8:
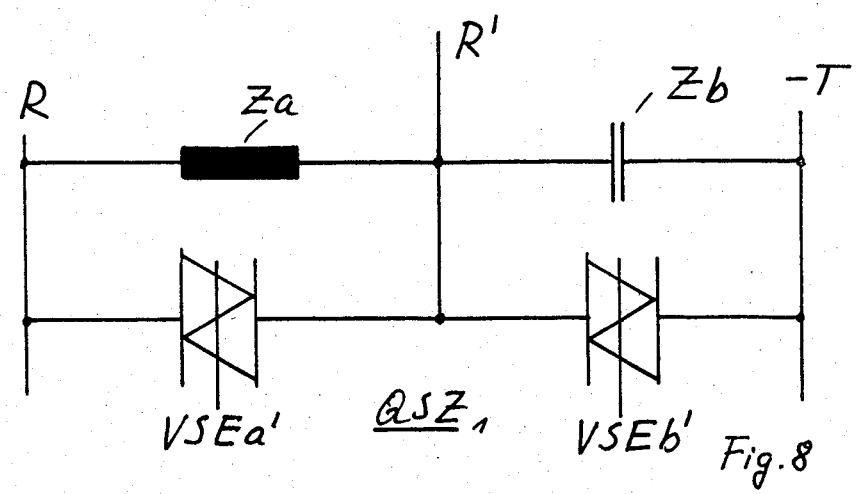
FIG. 8 illustrates a further embodiment of shunt circuit branch containing parallel connected-valve switching device.

FIG. 8 illustrates one such embodiment with valve switching devices VSEa' and VSEb'. In consideration of the discharge current surge, upon shunting of a capacitive impedance Zb by the switching valve VSEb', an auxiliary impedance Zh (FIG. 9) is incorporated in series with the valve switching branch for the purpose of current limiting. With appropriate dimensioning of the circuit such alters nothing as far as the capacitive character of the entire impedance at this side of the secondary terminal R' is concerned.

The valve switching devices, arranged in parallel with respect to the related impedance, render possible a complete short-circuiting or approximate short-circuiting of the related impedance, so that the primary phase angle—in FIG. 8 in other words the phase angle between the primary terminals R and —T—is completely or extensively utilized for the control phase angle. Also here there is advantageously provided an opposite or complementary control of the gating ratio of the valve switching devices to both sides of the secondary terminal. Moreover, simplified embodiments utilizing phase shift in only one direction with respect to the starting state, enable employing a valve switching device only at one side of the secondary terminal.

Figure 9:
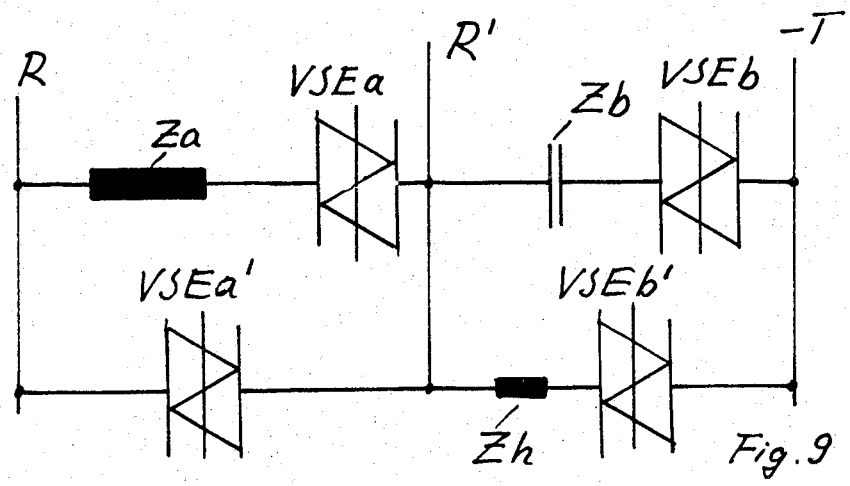
FIG. 9 illustrates the construction of a shunt switching branch with combined series and parallel circuit arrangement of valve switching devices for variable phase shifts.

Finally, FIG. 9 illustrates a combined embodiment containing features shown in both FIGS. 7 and 8, i.e., having valve switching devices arranged in series and in parallel with respect to the impedances Za and Zb. With such circuit, again employing opposite or complementary gating ratio control, it is possible to additionally influence the inductive or capacitive character and the magnitude of the effective impedances, and thus, the reactive load of the system apart from the phase shift in accordance with the momentary requirements of the network.

While there are shown and described present preferred embodiments of the invention, it is to be distinctly understood that the invention is not limited thereto, but may be otherwise variously embodied and practiced within the scope of the following claims. Accordingly,

What we claim is:

1. A controllable phase shifter for an alternating current-transmission system, especially for a power line network, comprising:
    a shunt circuit branch arranged between at least two primary side terminals of the transmission system which carry voltages which are phase shifted with respect to one another;
    said shunt circuit branch containing at least two series connected reactive impedances which are complementary to one another and a tap arranged between said impedances and serving as a secondary side terminal and at least one valve switching device;
    said valve switching device being arranged in series with respect to one of the reactive impedances at least at one side of the tap of the shunt circuit branch; and
    a control device provided for the valve switching device for selectively setting at least any one of different cut-off or cut-on intervals, or both, of the valve switching device.

2. The controllable phase shifter for a multi-phase-transmission system as defined in claim 1, wherein:
    at least one pair of primary side-terminals operatively associated in each case with a secondary side terminal carry voltages which are shifted in relation to a primary phase angle differing from an intermediate phase angle of the multi-phase system.

3. The controllable phase shifter as defined in claim 2, wherein:
    said alternating current-transmission system having primary-side terminals;
    said shunt circuit branch having an input side;
    a network transformer for connecting the input side of said shunt circuit branch with said primary-side terminals of the transmission system;
    said network transformer having two secondary winding systems each having a phase winding and between which secondary winding systems there can be provided a primary phase angle; and said shunt circuit branch being operatively connected at its input side with a phase winding of the one secondary winding system and with a phase winding of the other secondary winding system of said network transformer.

4. The controllable phase shifter as defined in claim 2, wherein:
    said primary phase angle is smaller than the intermediate phase angle.

5. The controllable phase shifter as defined in claim 1, further including:
    a respective valve switching device provided to each side of the secondary side terminal.

6. The controllable phase shifter as defined in claim 5, wherein:
    the valve switching devices are controllable at both sides of the secondary side terminal with oppositely alterable cut-on and cut-off intervals.

7. The controllable phase shifter as defined in claim 1, wherein:
    said valve switching device is arranged parallel to the reactive impedance at least at one side of the tap of the shunt switching branch.

8. The controllable phase shifter as defined in claim 7, further including:
    a respective valve switching device arranged in parallel with respective ones of the reactive impedances arranged to each side of the secondary side terminal.

9. The controllable phase shifter as defined in claim 8, wherein:
    the valve switching devices are controllable at both sides of the secondary side terminal with oppositely alterable cut-on and cut-off intervals.

10. The controllable phase shifter as defined in claim 1, wherein:
    said at least one valve switching device is a valve switching device with firing angle control for purpose of phase angle control.

* * * * *